US011705864B2

(12) United States Patent
Jo et al.

(10) Patent No.: US 11,705,864 B2
(45) Date of Patent: Jul. 18, 2023

(54) VOLTAGE-CONTROLLED OSCILLATOR (71) Applicant: Nippon Telegraph and Telephone Corporation, Tokyo (JP)

(72) Inventors: Teruo Jo, Tokyo (JP); Munehiko Nagatani, Tokyo (JP); Hideyuki Nosaka, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 17/630,246

(22) PCT Filed: Aug. 5, 2019

(86) PCT No.: PCT/JP2019/030675
§ 371 (c)(1),
(2) Date: Jan. 26, 2022

(87) PCT Pub. No.: WO2021/024345
PCT Pub. Date: Feb. 11, 2021

(65) Prior Publication Data
US 2022/0286088 A1 Sep. 8, 2022

(51) Int. Cl.
*H03B 5/12* (2006.01)
(52) U.S. Cl.
CPC ......... *H03B 5/1296* (2013.01); *H03B 5/1212* (2013.01); *H03B 5/1228* (2013.01); *H03B 5/1275* (2013.01)

(58) Field of Classification Search
CPC .. H03B 5/1228; H03B 5/1296; H03B 5/1215; H03B 5/1212
See application file for complete search history.

(56) References Cited

U.S. PATENT DOCUMENTS

| 9,379,663 B1* | 6/2016 | Kundu ................ H03B 5/1212 |
| 2002/0145481 A1* | 10/2002 | Murgulescu ......... H03B 5/1296 331/117 R |
| 2004/0066236 A1 | 4/2004 | Fujimoto et al. |
| 2012/0212300 A1* | 8/2012 | Tang .................... H03B 5/1243 331/117 FE |

FOREIGN PATENT DOCUMENTS

| JP | 2004165612 A | 6/2004 |
| JP | 2018011167 A | 1/2018 |

* cited by examiner

*Primary Examiner* — Ryan Johnson
(74) *Attorney, Agent, or Firm* — Slater Matsil, LLP (57) ABSTRACT

A first phase adjuster adjusts the phase of any one of first and second AC voltages generated in a negative resistance circuit so that a shift amount Φ in a first variable phase shifter falls within a range of 0 degrees≤Φ<180 degrees, and outputs the phase-adjusted AC voltage to the first variable phase shifter, and a second phase adjuster adjusts the phase of the other one of the first and second AC voltages generated in the negative resistance circuit so that a shift amount Φ in a second variable phase shifter falls within a range of 0 degrees≤Φ<180 degrees, and outputs the phase-adjusted AC voltage to the second variable phase shifter.

12 Claims, 8 Drawing Sheets

VOLTAGE-CONTROLLED OSCILLATOR

CROSS-REFERENCE TO RELATED APPLICATIONS

This application is a national phase entry of PCT Application No. PCT/JP2019/030675, filed on Aug. 5, 2019, which application is hereby incorporated herein by reference.

TECHNICAL FIELD

The present invention relates to a voltage-controlled oscillator using a negative resistance circuit.

BACKGROUND

Figure 7:
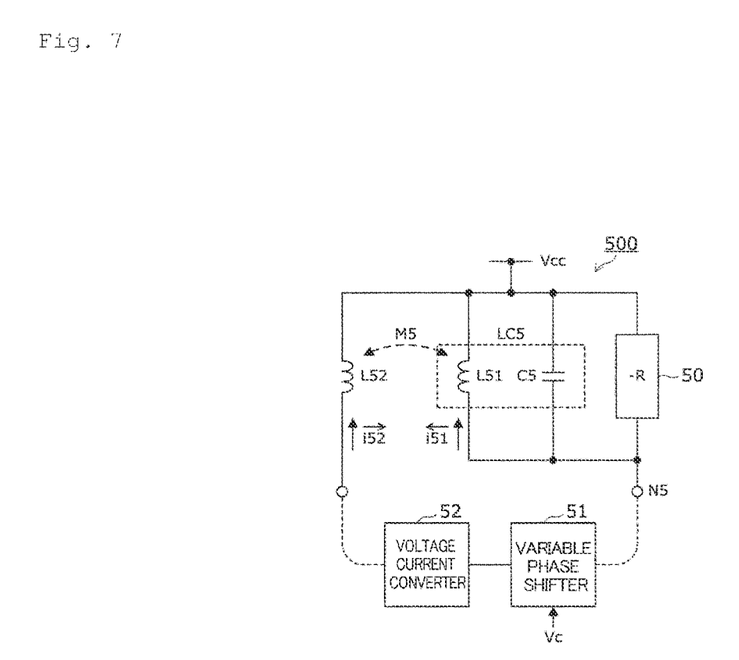
FIG. 7 is a circuit diagram showing a voltage-controlled oscillator in the related art.

VOLTAGE-CONTROLLED oscillators (VCO) having a wide frequency variable range are required in various applications such as wireless communication or radar. Particularly, in voltage-controlled oscillators having a high center frequency, voltage-controlled oscillators using variable mutual inductance as shown in FIG. 7 have been proposed in the related art as architecture in which a wide variable range is adopted (see PTL 1 and the like). FIG. 7 is a circuit diagram showing a voltage-controlled oscillator of the related art.

A voltage-controlled oscillator 500 in FIG. 7 includes an LC tank LC5 in which a primary inductor L51 and a capacitor C5 are connected to each other in parallel, a secondary inductor L52 magnetically coupled to the primary inductor L51 by a mutual inductance M5, and a negative resistance circuit 50 connected in parallel to the LC tank LC5. The variable phase shifter 51 phase-shifts an AC voltage generated in a connection node N5 of the negative resistance circuit 50 on the basis of an input control voltage Vc, and a voltage current converter 52 converts the phase-shifted AC voltage into an AC current i52 and supplies the AC current i52 to the secondary inductor L52.

Thereby, the value of the mutual inductance M5 changes by changing the phase of the AC current i52 of the secondary inductor L52 with respect to an AC current i51 of the primary inductor L51, and consequently, an oscillation frequency changes.

Figure 8:
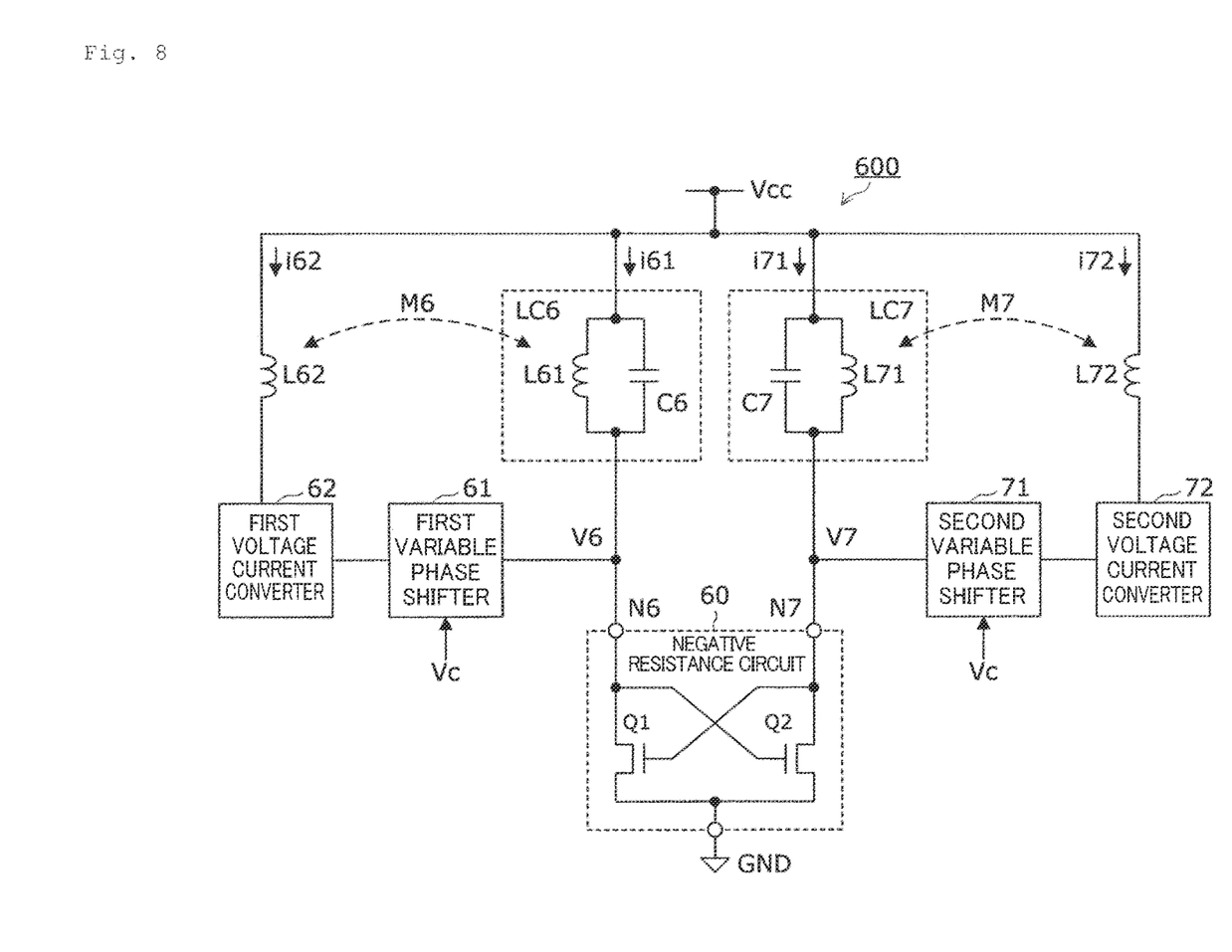
FIG. 8 is a circuit diagram showing another voltage-controlled oscillator in the related art.

In the related art, an example in which a cross-coupled negative resistance circuit as shown in FIG. 8 for obtaining a differential output is used as a voltage-controlled oscillator has been proposed (see PTL 2 and the like). FIG. 8 is a circuit diagram showing another voltage-controlled oscillator of the related art. A voltage-controlled oscillator 600 in FIG. 8 includes two sets of an LC tank and a secondary inductor that are paired, and also includes two sets of a variable phase shifter and a voltage current converter that are paired.

That is, the voltage-controlled oscillator 600 includes an LC tank LC6 in which a primary inductor L61 and a capacitor C6 are connected to each other in parallel, a secondary inductor L62 magnetically coupled to the primary inductor L61 by a mutual inductance M6, an LC tank LC7 in which a primary inductor L71 and a capacitor C7 are connected to each other in parallel, a secondary inductor L72 magnetically coupled to the primary inductor L71 by a mutual inductance M7, and a negative resistance circuit 60 connected in parallel to the LC tanks LC6 and LC7 in terms of AC.

A variable phase shifter 61 phase-shifts an AC voltage V6 generated in a connection node N6 of the negative resistance circuit 60 on the basis of an input control voltage Vc, and a voltage current converter 62 converts the phase-shifted AC voltage V6 into an AC current i62 and supplies the AC current i62 to the secondary inductor L62.

In addition, a variable phase shifter 71 phase-shifts an AC voltage V7 generated in a connection node N7 of the negative resistance circuit 60 on the basis of an input control voltage Vc, and a voltage current converter 72 converts the phase-shifted AC voltage V7 into an AC current i72 and supplies the AC current i72 to the secondary inductor L72.

According to a configuration example of FIG. 8, two variable phase shifters 61 and 71 and two secondary inductors L62 and L72 are provided in response to the primary inductors L61 and L71, and thus it is possible to configure an oscillator using changes in the mutual inductances M6 and M7 similar to those in FIG. 7.

In a case where the values of the primary inductors L61 and L71 are assumed to be L1, the values of the secondary inductors L62 and L72 are assumed to be L2, the values of the mutual inductances M6 and M7 are assumed to be M, a coupling coefficient is assumed to be k, the values of the capacitors C6 and C7 are assumed to be C, the values of AC currents i61 and i62 are respectively assumed to be i1 and i2, the phases of the AC currents i61 and i62 are respectively assumed to be θ1 and θ2, a phase difference therebetween is assumed to be θ, and a current ratio between the AC currents i61 and i62 is assumed to be α, an oscillation frequency f of the voltage-controlled oscillator 600 in FIG. 8 is represented by the following Expression (1).

$$f = \frac{1}{2\pi} \sqrt{\frac{L_1 + \alpha M \cos\theta}{C(L_1^2 + 2L_1 \alpha M \cos\theta + \alpha^2 M^2)}} \quad (1)$$

$$\left( \alpha = \frac{\vec{i_2}}{\vec{i_1}} = \frac{i_2}{i_1} e^{j(\theta_2 - \theta_1)} = \frac{i_2}{i_1} e^{j\theta} \right)$$

$$M = k\sqrt{L_1 L_2}$$

Figure 9:
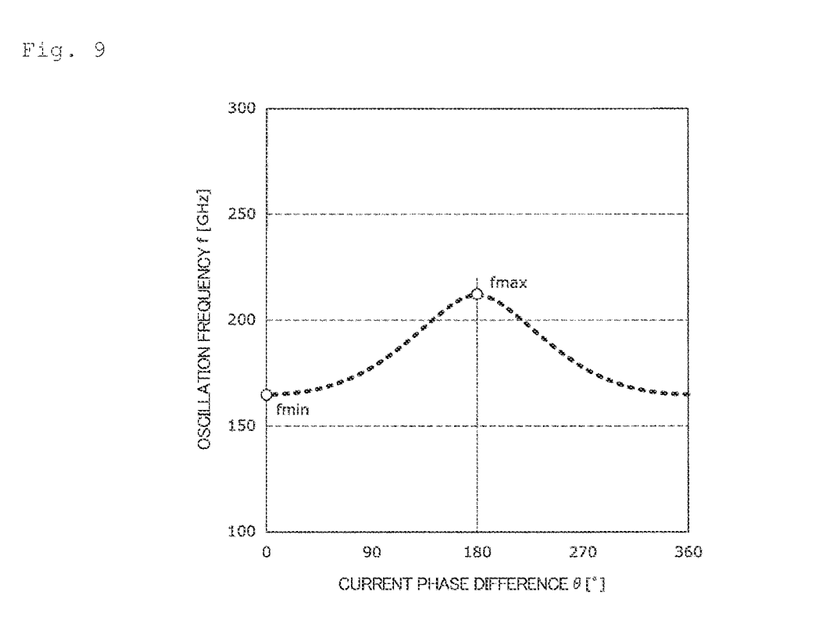
FIG. 9 is a graph showing oscillation frequency characteristics (simulation) in FIG. 8.

FIG. 9 is a graph showing oscillation frequency characteristics (simulation) in FIG. 8. FIG. 9 shows an example of oscillation frequency characteristics obtained by simulation in a case where relations of L61=L62=L71=L72=15 pH, C6=C7=50 f, α=0.25, and k=1 are established in the circuit shown in FIG. 8, and a phase difference θ of the AC current i62 with respect to the AC current i61 is changed in a range of 0 degrees≤θ<360 degrees. As can be seen from FIG. 9, an oscillation frequency f from a minimum fmin to a maximum fmax can be obtained when a phase difference θ between AC currents flowing to the primary inductor L61 and the secondary inductor L62 is in a range of 0 degrees 6<180 degrees, and thus a variable range of a shift amount Φ in the variable phase shifter 61 may be basically 0 degrees≤Φ<180 degrees.

CITATION LIST

Patent Literature

PTL 1—Japanese Patent Application Publication No. 2004-165612

PTL 2—Japanese Patent Application Publication No. 2018-11167

SUMMARY

Technical Problem

In the above-described voltage-controlled oscillator 600 of the related art shown in FIG. 8, the variable phase shifters

61 and 71, the voltage current converters 62 and 72, wirings, and the like are actually provided between an output of the primary inductor L61 and an input of the secondary inductor L62, that is, between the connection nodes N6 and N7 of the negative resistance circuit 60 and the secondary inductors L62 and L72, and thus a phase offset of a fixed amount is further generated with respect to a phase shifted by the variable phase shifters 61 and 71. For this reason, when a shift amount θ in the variable phase shifters 61 and 71 is narrowed to be in a phase range $0 \leq \theta < 180$ degrees, there is a strong possibility that an oscillation frequency f from a minimum fmin to a maximum fmax will not be obtained, and a range of $0$ degrees$\leq \Phi < 360$ degrees is required as a variable range of the variable phase shifters 61 and 71.

Figure 10:
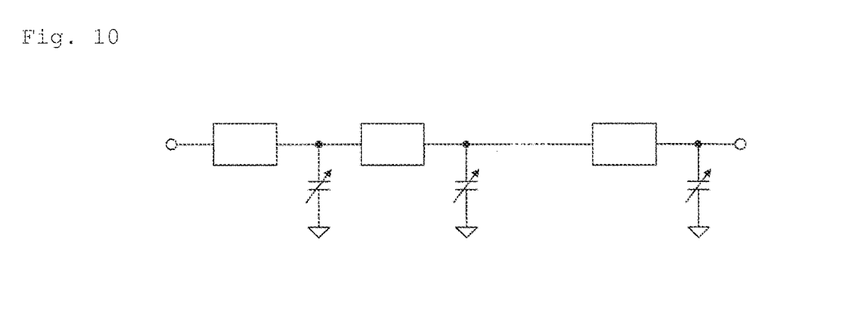
FIG. 10 is a circuit diagram showing a variable phase shifter using a transmission line and a varactor.

However, a variable phase shifter for realizing a variable range of $0$ degrees$\leq \Phi < 360$ degrees leads to an increase in a circuit area and an increase of loss. FIG. 10 is a circuit diagram showing a variable phase shifter using a transmission line and a varactor. For example, when the variable phase shifter using the transmission line and the varactor as shown in FIG. 10 is considered as an example, it is necessary to increase the length of the transmission line and the number of varactors in order to increase a phase amount, which leads to increases in the area of a circuit, complexity, and a transmission loss. An increase in a transmission loss means that an amplitude converted from the AC voltage V6 of the primary inductor L61 to the AC current i62 of the secondary inductor L62 is attenuated, which leads to narrowing of an oscillation frequency range.

Embodiments of the present invention are contrived in view of such problems, and an object thereof is to realize a wide variable range while suppressing increases in the area of a circuit, complexity, and a transmission loss.

Means for Solving the Problem

In order to achieve such an object, a voltage-controlled oscillator according to embodiments of the present invention includes first and second LC tanks, a first secondary inductor that is magnetically coupled to a first primary inductor included in the first LC tank, a second secondary inductor that is magnetically coupled to a second primary inductor included in the second LC tank, a negative resistance circuit that generates first and second AC voltages having opposite phases in first and second connection nodes to which the first and second LC tanks are connected, a first phase adjuster that adjusts a phase of any one of the first and second AC voltages and outputs the phase-adjusted AC voltage, a second phase adjuster that adjusts a phase of the other one of the first and second AC voltages and outputs the phase-adjusted AC voltage, a first variable phase shifter that phase-shifts the AC voltage switched and output from the first phase adjuster by a shift amount corresponding to an input control voltage, a second variable phase shifter that phase-shifts the AC voltage switched and output from the second phase adjuster by a shift amount corresponding to the control voltage, a first voltage current converter that converts the phase-shifted AC voltage output from the first variable phase shifter into an AC current and supplies the AC current to the first secondary inductor, and a second voltage current converter that converts the phase-shifted AC voltage output from the second variable phase shifter into an AC current and supplies the AC current to the second secondary inductor.

Effects of Embodiments of the Invention

According to embodiments of the present invention, a shift amount Φ in first and second variable phase shifters falls within a range of $0$ degrees$\leq \Phi < 180$ degrees. Thus, a variable range of $0$ degrees$\leq \Phi < 360$ degrees is not required in the first and second variable phase shifters, and it is possible to realize a wide variable range while suppressing increases in the area of a circuit, complexity, and a transmission loss.

DETAILED DESCRIPTION OF ILLUSTRATIVE EMBODIMENTS

Next, embodiments of the present invention will be described with reference to the drawings.

First Embodiment

Figure 1:
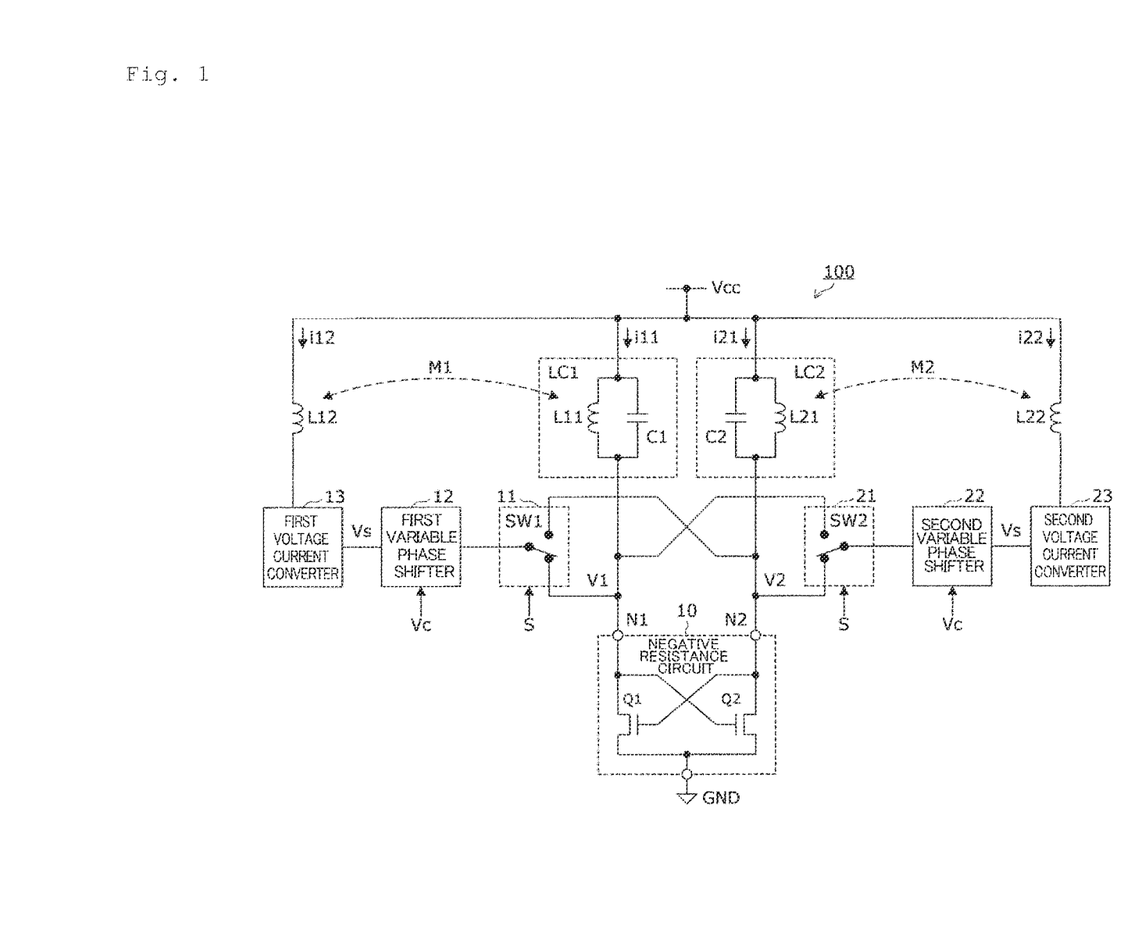
FIG. 1 is a block diagram showing a configuration of a voltage-controlled oscillator according to a first embodiment.

First, a voltage-controlled oscillator 100 according to a first embodiment of the present invention will be described with reference to FIG. 1. FIG. 1 is a block diagram showing a configuration of the voltage-controlled oscillator according to the first embodiment.

Voltage-Controlled Oscillator

The voltage-controlled oscillator 100 is constituted by a voltage-controlled oscillator using a negative resistance circuit as a whole, and includes a negative resistance circuit 10, a first LC tank LC1, a second LC tank LC2, a first secondary inductor L12, a second secondary inductor L22, a first phase adjuster 11, a first variable phase shifter 12, a first voltage current converter 13, a second phase adjuster 21, a second variable phase shifter 22, and a second voltage current converter 23 as main circuits.

The voltage-controlled oscillator 100 may be realized by a semiconductor integrated circuit of one chip in which all of the circuits of the voltage-controlled oscillator 100 are formed on one semiconductor substrate, for example, by a known CMOS manufacturing process. Alternatively, the voltage-controlled oscillator may be realized by an electronic circuit module in which some circuit elements are configured as discrete components, the other circuits are constituted by a semiconductor integrated circuit of one chip or a multi-chip circuit, and these circuits are mounted on one circuit board.

Negative Resistance Circuit

The negative resistance circuit 10 is a cross-coupled negative resistance circuit that generates a negative resistance of which an apparent resistance value indicates a negative value with respect to a voltage applied to first and second connection nodes N1 and N2. The negative resistance circuit 10 includes first and second transistors Q1 and Q2 as main circuits. Hereinafter, a case where the first and second transistors Q1 and Q2 are constituted by a MOS transistor will be described as an example. However, the present invention is not limited thereto, and the first and second transistors may be bipolar transistors. In addition, a case where the first and second transistors Q1 and Q2 are N-type channels will be described as an example, but the first and second transistors may be P-type channels.

In the first transistor Q1, a drain electrode is connected to the first connection node N1, a source electrode is connected to a ground potential node GND, and a gate electrode is connected to the second connection node N2. In the second transistor Q2, a drain electrode is connected to the second connection node N2, a source electrode is connected to the ground potential node GND, and a gate electrode is connected to the first connection node N1.

Thereby, the drain electrode of the first transistor Q1 and the gate electrode of the second transistor Q2 are connected to each other, and the drain electrode of the second transistor Q2 and the gate electrode of the first transistor Q1 are connected to each other. Hereinafter, an AC voltage generated in the first connection node N1 will be referred to as a first AC voltage V1, and an AC voltage, generated in the second connection node N2, which has a phase opposite to that of the first AC voltage V1 will be referred to as a second AC voltage V2.

First and Second LC Tanks

The first LC tank LC1 is constituted by an LC resonance circuit in which a first primary inductor L11 and a first capacitor C1 are connected to each other in parallel, and is configured such that one end thereof is connected to a power potential node Vcc, and the other end is connected to the first connection node N1 of the negative resistance circuit 10. The second LC tank LC2 is constituted by an LC resonance circuit in which a second primary inductor L21 and a second capacitor C2 are connected to each other in parallel, and is configured such that one end thereof is connected to the power potential node Vcc, and the other end is connected to the second connection node N2 of the negative resistance circuit 10.

In the first and second LC tanks LC1 and LC2, it is assumed that the first primary inductor L11 and the second primary inductor L21 have the same value, and the first capacitor C1 and the second capacitor C2 have the same value. Hereinafter, an AC current flowing to the first LC tank LC1 will be referred to as a first primary AC current i11, and an AC current flowing to the second LC tank LC2 will be referred to as a second primary AC current i21.

First and Second Secondary Inductors

The first secondary inductor L12 is an inductor in which one end thereof is connected to the power potential node Vcc, and the other end is connected to the first voltage current converter 13. The first secondary inductor L12 is magnetically coupled to the first primary inductor L11 of the first LC tank LC1 by a first mutual inductance M1. The second secondary inductor L22 is an inductor in which one end thereof is connected to the power potential node Vcc, and the other end is connected to the second voltage current converter 23.

The second secondary inductor L22 is magnetically coupled to the second primary inductor L21 of the second LC tank LC2 by a second mutual inductance M2. It is assumed that the first secondary inductor L12 and the second secondary inductor L22 have the same value, and the first mutual inductance M1 and the second mutual inductance M2 have the same value. Hereinafter, an AC current flowing to the first secondary inductor L12 will be referred to as a first secondary AC current i12, and an AC current flowing to the second inductor L22 will be referred to as a second secondary AC current i22.

First and Second Variable Phase Shifters

The first variable phase shifter 12 shifts the phase of an AC voltage of which the phase has been adjusted and which is output from the first phase adjuster 11 on the basis of a shift amount $\Phi$ in a range of 0 degrees≤$\Phi$<180 degrees corresponding to a phase control signal Vc, and outputs the phase-shifted AC voltage to the first voltage current converter 13. The second variable phase shifter 22 shifts the phase of an AC voltage of which the phase has been adjusted and which is output from the second phase adjuster 21 on the basis of a shift amount 1 in a range of 0 degrees≤$\Phi$<180 degrees corresponding to the phase control signal Vc, and outputs the phase-shifted AC voltage to the second voltage current converter 23. As a specific circuit configuration of the first and second variable phase shifters 12 and 22, for example, a circuit configuration disclosed in PTL 2 may be used.

First and Second Voltage Current Converters

The first voltage current converter 13 converts a phase-shifted AC voltage output from the first variable phase shifter 12 into the first secondary AC current i12 and supplies the converted first secondary AC current to the first secondary inductor L12. The second voltage current converter 23 converts a phase-shifted AC voltage output from the second variable phase shifter 22 into the second secondary AC current i22 and supplies the converted second secondary AC current to the second secondary inductor L22. As a specific circuit configuration of the first and second voltage current converters 13 and 23, for example, a circuit configuration disclosed in PTL 2 may be used.

First and Second Phase Adjusters

The first phase adjuster 11 adjusts the phase of any one of the first and second AC voltages V1 and V2 and outputs the phase-adjusted AC voltage. At this time, the first phase adjuster 11 adjusts the phase of any one of the first and second AC voltages V1 and V2 so that a shift amount $\Phi$ in the first variable phase shifter 12 falls within a range of 0 degrees≤$\Phi$<180 degrees, and outputs the phase-adjusted AC voltage. The second phase adjuster 21 adjusts the phase of any one of the first and second AC voltages V1 and V2 and outputs the phase-adjusted AC voltage. At this time, the second phase adjuster 21 adjusts the phase of any one of the first and second AC voltages V1 and V2 so that a shift amount $\Phi$ in the second variable phase shifter 22 falls within a range of 0 degrees≤$\Phi$<180 degrees and outputs the phase-adjusted AC voltage.

First and Second Switches

Specific examples of the first and second phase adjusters 11 and 21 include first and second switches SW1 and SW2. The first switch SW1 switches any one of AC voltages, generated in the first connection node N1 and the second connection node N2 of the negative resistance circuit 10, which have opposite phases to the first variable phase shifter 12 on the basis of a switching signal S and outputs the switched AC voltage. The second switch SW2 switches the other AC voltage of the first connection node N1 or the second connection node N2 of the negative resistance circuit 10 to the second variable phase shifter 22 on the basis of a switching signal S and outputs the switched AC voltage.

Thereby, the first and second switches SW1 and SW2 switch connection nodes on opposite sides out of the first connection node N1 and the second connection node N2 to the corresponding first and second variable phase shifters 12 and 22 and connect the connection nodes in accordance with a switching signal S.

In addition, the switching signal S is switched in accordance with a case where a phase difference θ in a range of 0 degrees≤θ<180 degrees is required and a case where a phase difference θ in a range of 180 degrees≤θ<360 degrees is required, between the first primary AC current i11 flowing to the first LC tank LC1 and the first secondary AC current i12 flowing to the first secondary inductor L12.

That is, in a case where a phase difference between the first primary AC current i11 and the first secondary AC current i12 is in a range of equal to or greater than 0 degrees and less than 180 degrees, the switching signal S is constituted by a switching signal for instructing the first switch SW1 to switch and output the first AC voltage V1 and instructing the second switch SW2 to switch and output the second AC voltage V2. Further, in a case where a phase difference is in a range of equal to or greater than 180 degrees and less than 360 degrees, the switching signal S is constituted by a switching signal S for instructing the first switch SW1 to switch and output the second AC voltage V2 and instructing the second switch SW2 to switch and output the first AC voltage V1.

Meanwhile, a switch for performing a switching operation opposite to that of the first switch SW1 may be used as the second switch SW2, and in this case, a switching signal S having the same logic as that of the first switch SW1 may be supplied to the second switch SW2.

In addition, a switch circuit in which one of two switches performing on and off operations is connected in common may be used as the first and second switches SW1 and SW2. In this case, two on and off signals, indicating opposite logics, which are used to individually control the turn-on and turn-off of the two switches may be used as the switching signal S.

Thus, in a case where a phase difference θ in a range of 0 degrees≤θ<180 degrees is required between the first primary AC current i11 and the first secondary AC current i12, the first switch SW1 switches and connects the first connection node N1 to the first variable phase shifter 12 in accordance with the switching signal S. At this time, the second switch SW2 switches and connects the second connection node N2 to the second variable phase shifter 22 in accordance with the switching signal S.

At this time, when a shift amount Φ is in a range of 0 degrees≤Φ<180 degrees, it is possible to handle the first and second variable phase shifters 12 and 22. For this reason, the AC voltage V1 of the first connection node N1 is supplied to the first variable phase shifter 12, and the AC voltage V2 of the second connection node N2 is supplied to the second variable phase shifter 22. Thereby, a phase is adjusted by the first and second switches SW1 and SW2 so that a shift amount Φ in the first and second variable phase shifters 12 and 22 falls within a range of 0 degrees≤Φ<180 degrees.

On the other hand, in a case where a phase difference θ in a range of 180 degrees≤θ<360 degrees is required between the first primary AC current i11 and the first secondary AC current i12, the first switch SW1 switches and connects the second connection node N2 to the first variable phase shifter 12 in accordance with a switching signal S. At this time, the second switch SW2 switches and connects the first connection node N1 to the second variable phase shifter 22 in accordance with a switching signal S.

At this time, a phase difference between the first and second AC voltages V1 and V2 is 180 degrees at all times. Thus, when the AC voltage V2 is selected instead of the AC voltage V1, the phase of an AC voltage to be supplied to the first variable phase shifter 12 is adjusted by 180 degrees. Similarly, when the AC voltage V1 is selected instead of the AC voltage V2, the phase of an AC voltage to be supplied to the second variable phase shifter 22 is adjusted by 180 degrees. Thereby, a phase in the first and second switches SW1 and SW2 is adjusted so that a shift amount Φ in the first and second variable phase shifters 12 and 22 falls within a range of 0 degrees≤Φ<180 degrees.

Operations in First Embodiment

Next, operations of the voltage-controlled oscillator 100 according to the present embodiment will be described with reference to FIG. 1.

In the voltage-controlled oscillator 100 shown in FIG. 1, the first and second LC tanks LC1 and LC2 and the negative resistance circuit 10 are connected to each other in parallel in terms of AC. On the other hand, the negative resistance circuit 10 is a circuit generating a negative resistance that is, an amplifier circuit. For this reason, a first AC voltage V1 having a first oscillation frequency f1 corresponding to the value of each of the first primary inductor L11, the first capacitor C1, and the mutual inductance M1 is generated in the first connection node N1.

In addition, a second AC voltage V2 having a second oscillation frequency f2 corresponding to the value of each of the second primary inductor L21, the second capacitor C2, and the second mutual inductance M2 is generated in the second connection node N2.

At this time, since the values of the first primary inductor L11, the first capacitor C1, and the mutual inductance M1 and the values of the second primary inductor L21, the second capacitor C2, and the second mutual inductance M2 are equal to each other, the first oscillation frequency f1 and the second oscillation frequency f2 are also equal to each other. Thus, the values of the first and second primary AC currents i11 and i21 flowing to the first and second LC tanks LC1 and LC2 are also equal to each other, and the values of the first and second secondary AC currents i12 and i22 flowing to the first and second secondary inductors L12 and L22 are also equal to each other.

Case where Phase Difference θ in Range of 0 Degrees≤θ<180 Degrees is Required

Here, in a case where a phase difference θ in a range of 0 degrees≤θ<180 degrees is required between the first primary AC current i11 and the first secondary AC current i12, the phase of any one of the first and second AC voltages V1 and V2 is adjusted by the first phase adjuster 11 so that a shift amount Φ in the first variable phase shifter 12 falls within a range of 0 degrees≤Φ<180 degrees, and the phase-adjusted AC voltage is output. At this time, in a case where the first phase adjuster 11 is constituted by the first switch SW1, a first AC voltage V1 generated in the first connection node N1 is switched and supplied to the first variable phase shifter 12.

Thereby, the first AC voltage V1 is phase-shifted by a shift amount Φ corresponding to a phase control signal Vc in a range of 0 degrees≤Φ<180 degrees in the first variable phase shifter 12 and is output to the first voltage current converter 13 as a phase-shifted first AC voltage Vs1. The phase-shifted first AC voltage Vs1 is converted into the first secondary AC current i12 by the first voltage current converter 13 and is supplied to the first secondary inductor L12.

In addition, the phase of the other one of the first and second AC voltages V1 and V2 is adjusted by the second phase adjuster 21 so that a shift amount Φ in the second variable phase shifter 22 falls within a range of 0 degrees≤Φ<180 degrees, and the phase-shifted AC voltage is output. At this time, in a case where the second phase adjuster 21 is constituted by the second switch SW2, a second AC voltage V2 generated in the second connection node N2 is switched and supplied to the second variable phase shifter 22.

Thereby, the phase of the second AC voltage V2 is shifted by a shift amount 1 corresponding to a phase control signal Vc in a range of 0 degrees≤Φ<180 degrees in the second variable phase shifter 22 and is output to the second voltage current converter 23 as a phase-shifted second AC voltage Vs2. The phase-shifted second AC voltage Vs2 is converted into the second secondary current i22 by the second voltage current converter 23 and is supplied to the second secondary inductor L22.

Thus, the values of the mutual inductances M1 and M2 change by changing the phases of the first and second secondary AC currents i12 and i22 with respect to the first and second primary AC currents i11 and i21, and consequently, an oscillation frequency f changes.

Case where Phase Difference θ in Range of 180 Degrees≤θ<360 Degrees is Required

On the other hand, in a case where a phase difference θ in a range of 180 degrees≤θ<360 degrees is required between the first primary AC current i11 and the first secondary AC current i12, the phase of any one of the first and second AC voltages V1 and V2 is adjusted by the first phase adjuster 11 so that a shift amount Φ D in the first variable phase shifter 12 falls within a range of 0 degrees≤Φ<180 degrees, and the phase-adjusted AC voltage is output. At this time, in a case where the first phase adjuster 11 is constituted by the first switch SW1, a second AC voltage V2 generated in the second connection node N2 is switched and supplied to the first variable phase shifter 12 by the first phase adjuster 11.

Thereby, the second AC voltage V2 is phase-shifted by a shift amount c corresponding to a phase control signal Vc in a range of 0 degrees≤Φ<180 degrees in the first variable phase shifter 12 and is output to the first voltage current converter 13 as a phase-shifted second AC voltage Vs2. The phase-shifted second AC voltage Vs2 is converted into the first secondary AC current i12 by the first voltage current converter 13 is supplied to the first secondary inductor L12.

In addition, the phase of the other one of the first and second AC voltages V1 and V2 is adjusted by the second phase adjuster 21 so that a shift amount Φ in the second variable phase shifter 22 falls within a range of 0 degrees≤Φ<180 degrees, and the phase-adjusted AC voltage is output. At this time, in a case where the second phase adjuster 21 is constituted by the second switch SW2, a first AC voltage V1 generated in the first connection node N1 is switched and supplied to the second variable phase shifter 22 by the second phase adjuster 21.

Thereby, the first AC voltage V1 is phase-shifted by a shift amount Φ corresponding to a phase control signal Vc in a range of 0 degrees≤Φ<180 degrees in the second variable phase shifter 22 and is output to the second voltage current converter 23 as a phase-shifted first AC voltage Vs1. The phase-shifted first AC voltage Vs1 is converted into the second secondary AC current i22 by the second voltage current converter 23 and is supplied to the second secondary inductor L22.

Thus, the values of the mutual inductances M1 and M2 change by changing the phases of the first and second secondary AC currents i12 and i22 with respect to the first and second primary AC currents i11 and i21, and consequently, an oscillation frequency f changes.

Figure 2:
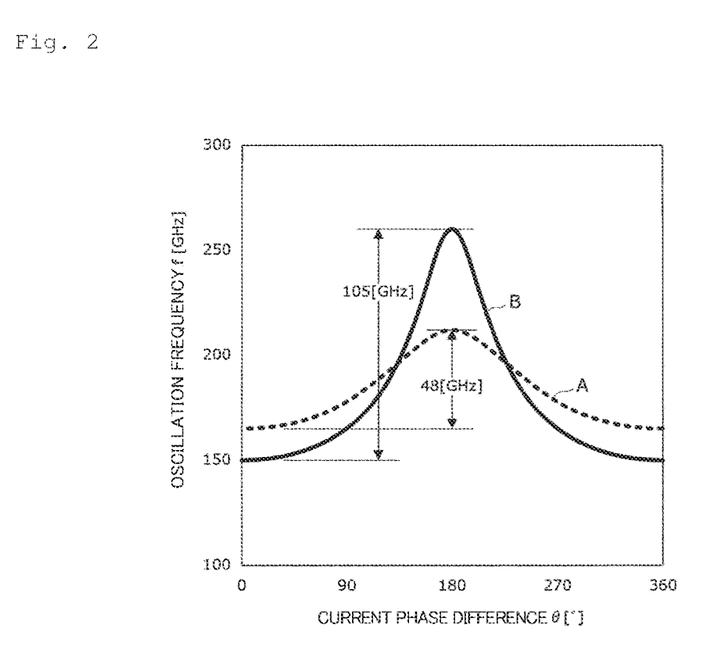
FIG. 2 is a graph showing oscillation frequency characteristics (simulation) in FIG. 1.

FIG. 2 is a graph showing oscillation frequency characteristics (simulation) in FIG. 1. FIG. 2 shows an example of oscillation frequency characteristics obtained by simulation in a case where relations of L11=L12=L21=L22=15 pH, C1=C2=50 f, k=1 are established in the circuit shown in FIG. 1, and a phase difference θ of the second secondary AC current i22 with respect to the first primary AC current i11 is changed in a range of 0 degrees≤θ<360 degrees. Meanwhile, in a case where a variable phase shifter having a variable range of 0 degrees≤θ<360 degrees is used, a transmission loss is large, and thus a current ratio is assumed to be 0.25. Further, in a case where a variable phase shifter having a variable range of 0 degrees≤θ<180 degrees is used as the first and second variable phase shifters 12 and 22, a transmission loss is small, and thus a current ratio is assumed to be 0.5.

As can be seen from FIG. 2, in a characteristic A in a case where a variable phase shifter having a variable range of 0 degrees≤θ<360 degrees is used as the first and second variable phase shifters 12 and 22, a variable range of an oscillation frequency is 48 GHz. On the other hand, in a characteristic B in a case where a variable phase shifter having a variable range of 0 degrees≤θ<180 degrees is used as the first and second variable phase shifters 12 and 22, a variable range of an oscillation frequency is extended to 105 GHz, and it can be understood that a wide variable range is realized.

Effects of First Embodiment

In this manner, in the present embodiment, the first phase adjuster 11 is configured to adjust the phase of any one of the first and second AC voltages V1 and V2 generated in the negative resistance circuit 10 so that a shift amount Φ in the first variable phase shifter 12 falls within a range of 0 degrees≤Φ<180 degrees and to output the phase-adjusted AC voltage to the first variable phase shifter 12, and the second phase adjuster 21 is configured to adjust the phase of the other one of the first and second AC voltages V1 and V2 generated in the negative resistance circuit 10 so that a shift amount Φ D in the second variable phase shifter 22 falls within a range of 0 degrees≤Φ<180 degrees and to output the phase-adjusted AC voltage to the second variable phase shifter 22.

Specifically, the first phase adjuster 11 is constituted by a first switch SW1 that switches and outputs any one of the first and second AC voltages V1 and V2 in accordance with an input switching signal S, and the second phase adjuster 21 is constituted by a second switch SW2 that switches and outputs the other one of the first and second AC voltages V1 and V2 in accordance with the switching signal S.

Thereby, the phases of the AC voltages V1 and V2 generated in the negative resistance circuit 10 are adjusted by the first and second phase adjusters 11 and 21 and are input to the first and second variable phase shifters 12 and 22. For this reason, a shift amount Φ in the first and second variable phase shifters 12 and 22 falls within a range of 0 degrees≤Φ<180 degrees. Thus, a variable range of 0 degrees≤Φ<360 degrees is not required in the first and second variable phase shifters 12 and 22, and it is possible to realize a wide variable range while suppressing increases in the area of a circuit, complexity, and a transmission loss.

Second Embodiment

Figure 3:
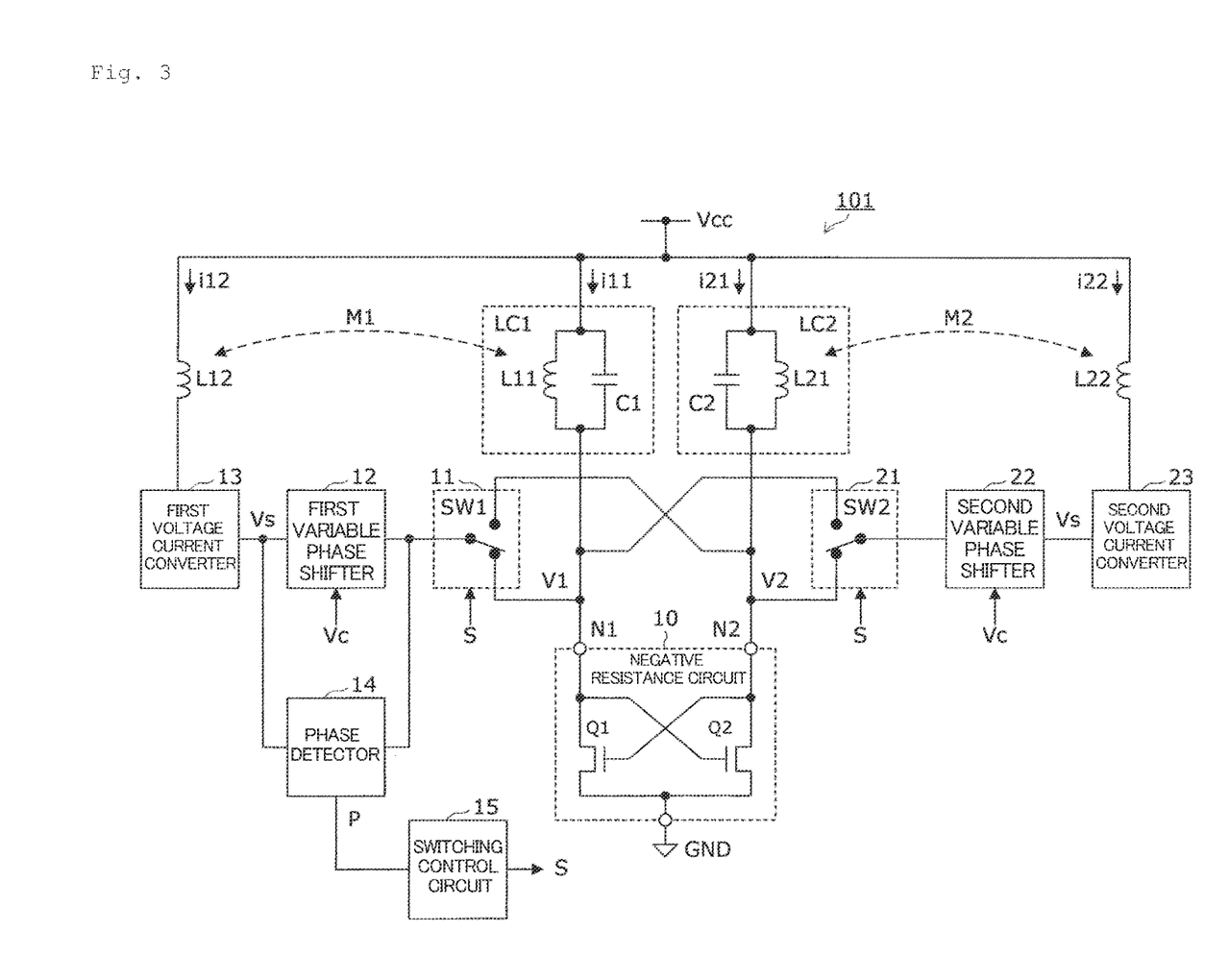
FIG. 3 is a block diagram showing a voltage-controlled oscillator according to a second embodiment.

Next, a voltage-controlled oscillator 101 according to a second embodiment of the present invention will be described with reference to FIG. 3. FIG. 3 is a block diagram showing a voltage-controlled oscillator according to the second embodiment.

In the configuration example of FIG. 1, in a case where it is desired to continuously change a phase from 0 degrees to 360 degrees, it is necessary to switch first and second switches SW1 and SW2 at the moment when a shift amount Φ in first and second variable phase shifters 12 and 22 is set to exactly 180 degrees. However, actually, it may be difficult to switch the first and second switches SW1 and SW2 when the shift amount Φ is exactly 180 degrees, due to manufacturing variations of the first and second variable phase shifters 12 and 22, variations in control voltage Vc, and the like.

In the present embodiment, FIG. 3 shows a configuration in which a phase detector 14 that monitors a shift amount Φ of the first variable phase shifter 12, and a switching control circuit 15 that generates a switching signal S on the basis of a phase-shift amount signal P indicating the detected shift amount Φ D and outputs the generated switching signal S are added to the configuration of FIG. 1. The other configurations of the voltage-controlled oscillator 101 according to the present embodiment are the same as those in FIG. 1, and detailed description thereof will be omitted here.

Phase Detector

The phase detector 14 is a general circuit in which an output voltage changes linearly in accordance with a phase difference between two input AC voltages. In the present embodiment, an AC voltage input to the first variable phase shifter 12 and an AC voltage output from the first variable phase shifter 12 are input to the phase detector 14, and an obtained output voltage signal is used as a phase-shift amount signal P indicating a shift amount Φ of the first variable phase shifter 12.

Switching Control Circuit

In a case where a phase-shift amount signal P indicates a phase-shift amount Φ in a range of 0 degrees≤Φ<180 degrees, the switching control circuit 15 outputs a switching signal for instructing the first switch SW1 to switch and output a first AC voltage V1 as a switching signal S. On the other hand, in a case where a phase-shift amount Φ indicates a phase-shift amount in a range of 180 degrees≤Φ<360 degrees, the switching control circuit 15 outputs a switching signal for instructing the first switch SW1 to switch and output a second AC voltage V2 as a switching signal S.

At this time, the switching control circuit 15 may output a switching signal S having a logic opposite to that of the first switch SW1 to the second switch SW2. That is, the switching control circuit outputs a switching signal for instructing the second switch SW2 to switch and output a second AC voltage V2 as a switching signal S in a case where the phase-shift amount signal P indicates a phase-shift amount Φ in a range of 0 degrees≤Φ<180 degrees, and the switching control circuit outputs a switching signal for instructing the second switch SW2 to switch and output a first AC voltage V1 as a switching signal S in a case where the phase-shift amount Φ P indicates a phase-shift amount in a range of 180 degrees≤Φ<360 degrees.

Thereby, it is possible to switch the first and second switches SW1 and SW2 at the moment when a shift amount Φ is set to exactly 180 degrees.

Meanwhile, a switch performing a switching operation opposite to that of the first switch SW1 may be used as the second switch SW2, and in this case, a switching signal S having the same logic as that of the first switch SW1 may be supplied to the second switch SW2.

In addition, a switch circuit in which one of two switches performing on and off operations is connected in common may be used as the first and second switches SW1 and SW2. In this case, two on and off signals, indicating opposite logics, which are used to individually control the turn-on and turn-off of the two switches may be used as the switching signal S.

Figure 4:
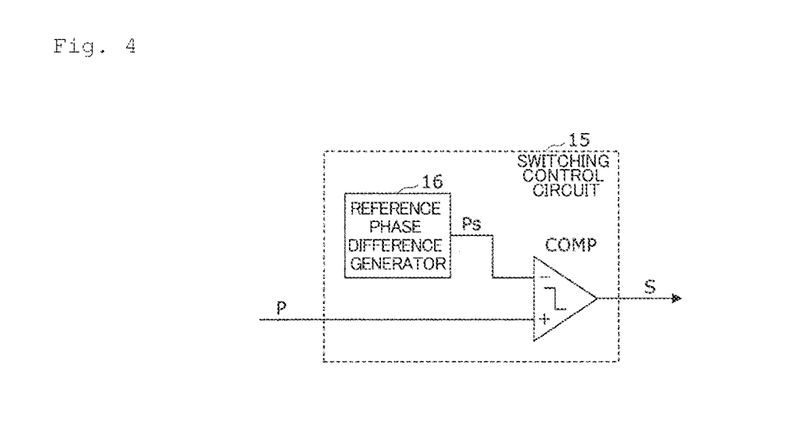
FIG. 4 is a block diagram showing a configuration example of a switching control circuit.

FIG. 4 is a block diagram showing a configuration example of a switching control circuit. As a specific example, FIG. 4 shows an example in which the switching control circuit 15 includes a reference phase difference generator 16 that generates a reference phase difference signal Ps indicating a phase difference of 180 degrees, and a comparator COMP that compares the reference phase difference signal Ps with a phase-shift amount signal P indicating a shift amount Φ of the first variable phase shifter 12 which is detected by the phase detector 14 (first phase detector).

In a case where the phase-shift amount signal P is smaller than the reference phase difference signal Ps, that is, in a case where the phase-shift amount signal P indicates a phase-shift amount Φ in a range of 0 degrees≤Φ<180 degrees, the comparator COMP outputs a switching signal for instructing the first switch SW1 to switch and output the first AC voltage V1 as a switching signal S. On the other hand, in a case where the phase-shift amount signal P is equal to or greater than the reference phase difference signal Ps, that is, in a case where the phase-shift amount Φ D indicates a phase-shift amount in a range of 180 degrees≤Φ<360 degrees, the comparator COMP outputs a switching signal for instructing the first switch SW1 to switch and output the second AC voltage V2 as a switching signal S. Thereby, it is possible to realize the switching control circuit 15 with a simple circuit configuration.

Figure 5:
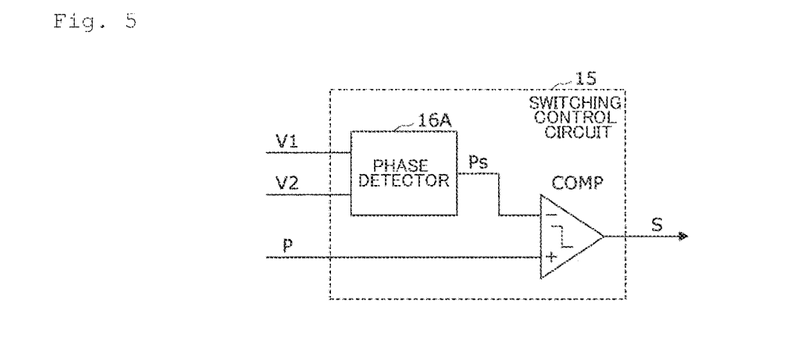
FIG. 5 is a block diagram showing another configuration example of a switching control circuit.

FIG. 5 is a block diagram showing another configuration example of a switching control circuit. In FIG. 5, the reference phase difference generator 16 shown in FIG. 4 includes a phase detector 16A (second phase detector) that detects a phase difference between the first and second AC voltages V1 and V2. That is, since a phase difference between the first and second AC voltages V1 and V2 is 180 degrees at all times, the phase difference is referred to as a reference phase difference. Thereby, it is possible to realize the switching control circuit 15 with a simpler circuit configuration.

Further, in the present embodiment, a case where a phase-shift amount of the first variable phase shifter 12 is detected by the phase detector 14 has been described as an example. However, the present invention is not limited thereto, and a phase-shift amount of the second variable phase shifter 22 may be detected by the phase detector 14.

Third Embodiment

Figure 6:
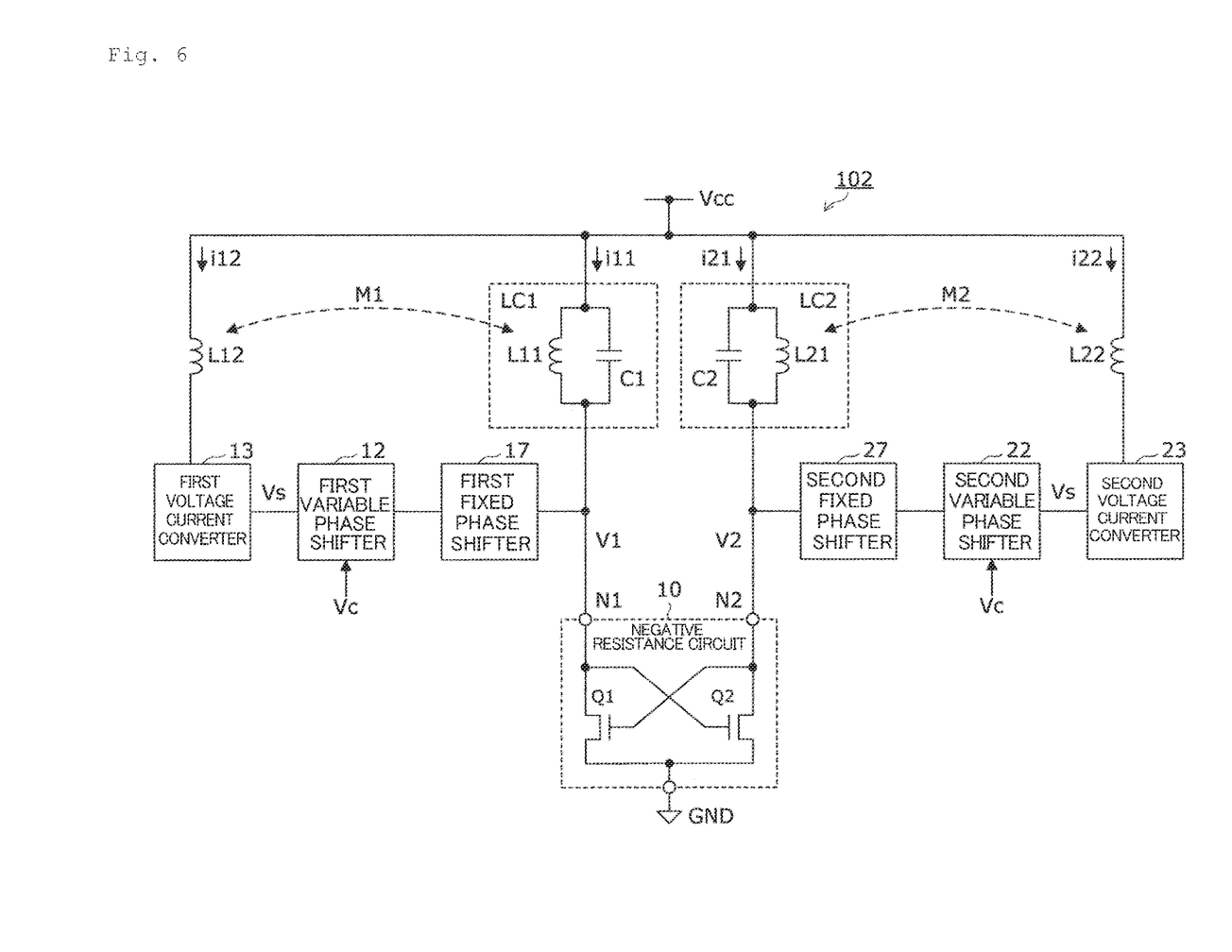
FIG. 6 is a block diagram showing a voltage-controlled oscillator according to a third embodiment.

Next, a voltage-controlled oscillator 102 according to a third embodiment of the present invention will be described with reference to FIG. 6. FIG. 6 is a block diagram showing a voltage-controlled oscillator according to the third embodiment.

A phase offset θoffset generated in first and second variable phase shifters 12 and 22, voltage current converters 13 and 23, wirings, and the like is a fixed phase difference and hardly fluctuates. In the present embodiment, first and second fixed phase shifters 17 and 27 that adjust a phase difference corresponding to the phase offset θoffset are used as first and second phase adjusters 11 and 21 focusing on a case where the phase offset θoffset can be accurately ascertained at the time of design or after manufacture. The other configuration of the voltage-controlled oscillator 102 according to the present embodiment is the same as those shown in FIG. 1, and detailed description will be omitted here.

First and Second Fixed Phase Shifters

The first fixed phase shifter 17 shifts the phase of any one of first and second AC voltages V1 and V2 by a fixed phase amount θadd which is set in advance, and outputs the phase-shifted AC voltage to the first variable phase shifter 12. The second fixed phase shifter 27 shifts the phase of the other one of the first and second AC voltages V1 and V2 by a fixed phase amount θadd which is set in advance, and outputs the phase-shifted AC voltage to the second variable phase shifter 22. Thereby, as compared with the configuration of FIG. 3, it is possible to realize a voltage-controlled oscillator with an extremely simple circuit configuration and to realize a wide variable range while suppressing increases in the area of a circuit, complexity, and a transmission loss.

At this time, the fixed phase amount θadd is not limited to a range of 0 degrees≤Φ<180 degrees. In a case where a phase offset is set to be θoffset, and N is set to an integer of 0 or greater, the fixed phase amount θadd is specified by the following Expression (2).

Math 2

$$\theta_{add} + \theta_{offset} = N \times 360° \quad (2)$$

Assuming that losses generated by the first and second fixed phase shifters 17 and 27 are small and losses generated by the first and second variable phase shifters 12 and 22 are dominant, the same effects as those of the above-described configuration of FIG. 5 are obtained by the configuration of FIG. 6. For example, in a case where a phase shifter having a fixed phase amount in a range of 0 degrees≤Φ<180 degrees is used as the first and second fixed phase shifters 17 and 27, it is possible to reduce a loss and expand a variable range of an oscillation frequency, as compared to the case of a phase shifter having a fixed phase amount in a range of 0 degrees≤Φ<360 degrees.

Expansion of Embodiments

Although the present invention has been described with reference to the embodiments, the present invention is not limited to the embodiments. Various changes that can be understood by those skilled in the art can be made to the configurations and details of the present invention within the scope of the present invention. In addition, the embodiments can be implemented in any combination within a consistent range.

REFERENCE SIGNS LIST

100, 101, 102 Voltage-controlled oscillator
10 Negative resistance circuit
11 first phase adjuster
12 first variable phase shifter
13 first voltage current converter
14 phase detector
15 switching control circuit
16 reference phase difference generator
16A phase detector
17 first fixed phase shifter
21 second phase adjuster
22 second variable phase shifter
23 second voltage current converter
27 second fixed phase shifter
LC1 first LC tank
L11 first primary inductor
L12 first secondary inductor
C1 first capacitor
LC2 second LC tank
L21 second primary inductor
L22 second secondary inductor
C2 second capacitor
N1 first connection node
N2 second connection node
V1 first AC voltage
V2 second AC voltage
i11 first primary AC current
i12 first secondary AC current
i21 second primary AC current
i22 second secondary AC current
Q1 first transistor
Q2 second transistor
Vcc power potential node
GND ground potential node.

The invention claimed is:

1. A voltage-controlled oscillator comprising:
   a first LC tank comprising a first primary inductor;
   a second LC tank comprising a second primary inductor;
   a first secondary inductor that is magnetically coupled to the first primary inductor;
   a second secondary inductor that is magnetically coupled to the second primary inductor;
   a negative resistance circuit configured to generates a first AC voltage and a second AC voltage in a first connection node and a second connection node to which the first LC tank and the second LC tank are connected, wherein the first AC voltage and the second AC voltage have opposite phases;
   a first phase adjuster configured to adjust a first phase of the first AC voltage or the second AC voltage and outputs a first phase-adjusted AC voltage, wherein the first phase adjuster comprises a first switch that switches and outputs the first AC voltage or the second AC voltage as the first phase-adjusted AC voltage in accordance with a switching signal;
   a second phase adjuster configured to adjusts a second phase of the first AC voltage or the second AC voltage and outputs a second phase-adjusted AC voltage, wherein the second phase adjuster is configured to adjust a different one of the first AC voltage or the second AC voltage than the first phase adjuster, wherein the second phase adjuster comprises a second switch that switches and outputs the first AC voltage or the second AC voltage as the second phase-adjusted AC voltage in accordance with the switching signal;
   a first variable phase shifter configured to phase-shift the first phase-adjusted AC voltage by a first shift amount corresponding to a control voltage and output a first phase-shifted AC voltage;
   a second variable phase shifter configured to phase-shift the second phase-adjusted AC voltage by a shift second amount corresponding to the control voltage and output a second phase-shifted AC voltage;
   a first voltage current converter configured to convert the first phase-shifted AC voltage into a first AC current and supply the first AC current to the first secondary inductor;
   a second voltage current converter configured to convert the second phase-shifted AC voltage output into a second AC current and supply the second AC current to the second secondary inductor;

a first phase detector configured to detect a phase-shift amount of an AC voltage in the first variable phase shifter or the second variable phase shifter and output a phase-shift amount signal indicating the phase-shift amount; and a switching control circuit configured to generate the switching signal based on the phase-shift amount signal output from the first phase detector and outputs the switching signal, wherein the switching signal instructs the first switch to switch and output the first AC voltage as the first phase-adjusted AC voltage or output the second AC voltage as the first phase-adjusted AC voltage.

2. The voltage-controlled oscillator according to claim 1, wherein:

the first phase adjuster is configured to adjust the first phase so that a first shift amount in the first variable phase shifter falls within a range of 0 degrees≤Φ<180 degrees; and the second phase adjuster is configured to adjust the second phase so that a second shift amount in the second variable phase shifter falls within a range of 0 degrees≤Φ<180 degrees.

3. The voltage-controlled oscillator according to claim 1, wherein the switching signal comprises:

a first switching signal instructing the first switch to switch and output the first AC voltage and instructing the second switch to switch and output the second AC voltage in a case where a phase difference between AC currents flowing to the first LC tank and the first secondary inductor is in a range of equal to or greater than 0 degrees and less than 180 degrees; and a second switching signal instructing the first switch to switch and output the second AC voltage and instructing the second switch to switch and output the first AC voltage in a case where the phase difference is in a range of equal to or greater than 180 degrees and less than 360 degrees.

4. The voltage-controlled oscillator according to claim 1, wherein the switching control circuit outputs a switching signal for instructing the first switch to switch and output the first AC voltage as the switching signal in a case where the phase-shift amount signal indicates a phase-shift amount in a range of equal to or greater than 0 degrees and less than 180 degrees, and outputs a switching signal for instructing the first switch to switch and output the second AC voltage as the switching signal in a case where the phase-shift amount indicates a phase-shift amount in a range of equal to or greater than 180 degrees and less than 360 degrees.

5. The voltage-controlled oscillator according to claim 4, wherein the switching control circuit includes:

a reference phase difference generator configured to output a reference phase difference signal indicating a phase difference of 180 degrees; and a comparator configured to compare the phase-shift amount signal output from the first phase detector with the reference phase difference signal output from the reference phase difference generator, output the switching signal in a case where the phase-shift amount signal is smaller than the reference phase difference signal, and output the switching signal in a case where the phase-shift amount signal is equal to or greater than the reference phase difference signal.

6. The voltage-controlled oscillator according to claim 5, wherein the reference phase difference generator is comprises a second phase detector configured to detect a phase difference between the first AC voltage and the second AC voltage.

7. A method comprising:

generating, by a negative resistance circuit configured, a first AC voltage and a second AC voltage in a first connection node and a second connection node to which a first LC tank and a second LC tank are connected, wherein the first AC voltage and the second AC voltage have opposite phases, wherein the first LC tank and the second LC tank each comprise a primary inductor;

adjusting, by a first phase adjustor, a first phase of the first AC voltage or the second AC voltage and outputting a first phase-adjusted AC voltage, wherein the first phase adjuster comprises a first switch that switches and outputs the first AC voltage or the second AC voltage as the first phase-adjusted AC voltage in accordance with a switching signal;

adjusting, by a second phase adjustor, a second phase of the first AC voltage or the second AC voltage and outputting a second phase-adjusted AC voltage, wherein the second phase adjuster is configured to adjust a different one of the first AC voltage or the second AC voltage than the first phase adjuster, wherein the second phase adjuster comprises a second switch that switches and outputs the first AC voltage or the second AC voltage as the second phase-adjusted AC voltage in accordance with the switching signal;

phase-shifting, by a first variable phase shifter, the first phase-adjusted AC voltage by a first shift amount corresponding to a control voltage and outputs a first phase-shifted AC voltage;

phase-shifting, by a second variable phase shifter, the second phase-adjusted AC voltage by a shift second amount corresponding to the control voltage and outputs a second phase-shifted AC voltage;

converting, by a first voltage current converter, the first phase-shifted AC voltage into a first AC current and supplying the first AC current to a first secondary inductor, the first secondary inductor being magnetically coupled to a primary inductor of the first LC tank;

converting, by a second voltage current converter, the second phase-shifted AC voltage output into a second AC current and supplying the second AC current to a second secondary inductor, the second secondary inductor being magnetically coupled to a primary inductor of the second LC tank;

detecting, by a first phase detector, a phase-shift amount of an AC voltage in the first variable phase shifter or the second variable phase shifter;

outputting, by the first phase detector, a phase-shift amount signal indicating the phase-shift amount;

generating, by a switching control circuit, the switching signal based on the phase-shift amount signal output from the first phase detector; and outputting, by the switching control circuit, the switching signal, wherein the switching signal instructs the first switch to switch and output the first AC voltage as the first phase-adjusted AC voltage or output the second AC voltage as the first phase-adjusted AC voltage.

8. The method according to claim 7, further comprising:

adjusting, by the first phase adjustor, the first phase so that a first shift amount in the first variable phase shifter falls within a range of 0 degrees≤Φ<180 degrees; and adjusting, by the second phase adjustor, the second phase so that a second shift amount in the second variable phase shifter falls within a range of 0 degrees≤Φ<180 degrees.

9. The method according to claim 7, wherein the switching signal comprises:
   a first switching signal instructing the first switch to switch and output the first AC voltage and instructing the second switch to switch and output the second AC voltage in a case where a phase difference between AC currents flowing to the first LC tank and the first secondary inductor is in a range of equal to or greater than 0 degrees and less than 180 degrees; and
   a second switching signal instructing the first switch to switch and output the second AC voltage and instructing the second switch to switch and output the first AC voltage in a case where the phase difference is in a range of equal to or greater than 180 degrees and less than 360 degrees.

10. The method according to claim 7, wherein the switching control circuit outputs a switching signal for instructing the first switch to switch and output the first AC voltage as the switching signal in a case where the phase-shift amount signal indicates a phase-shift amount in a range of equal to or greater than 0 degrees and less than 180 degrees, and outputs a switching signal for instructing the first switch to switch and output the second AC voltage as the switching signal in a case where the phase-shift amount indicates a phase-shift amount in a range of equal to or greater than 180 degrees and less than 360 degrees.

11. The method according to claim 10, wherein the switching control circuit includes:
    a reference phase difference generator that outputs a reference phase difference signal indicating a phase difference of 180 degrees; and
    a comparator that compares the phase-shift amount signal output from the first phase detector with the reference phase difference signal output from the reference phase difference generator, outputs the switching signal in a case where the phase-shift amount signal is smaller than the reference phase difference signal, and outputs the switching signal in a case where the phase-shift amount signal is equal to or greater than the reference phase difference signal.

12. The method according to claim 11, wherein the reference phase difference generator comprises a second phase detector that detects a phase difference between the first AC voltage and the second AC voltage.

* * * * *